United States Patent
Hasegawa et al.

(10) Patent No.: US 7,461,316 B2
(45) Date of Patent: *Dec. 2, 2008

(54) MULTI-STROBE GENERATION APPARATUS, TEST APPARATUS AND ADJUSTMENT METHOD

(75) Inventors: Takashi Hasegawa, Tokyo (JP); Masaru Doi, Tokyo (JP); Shinya Sato, Tokyo (JP)

(73) Assignee: Advantest Corporation, Tokyo (JP)

( * ) Notice: Subject to any disclaimer, the term of this patent is extended or adjusted under 35 U.S.C. 154(b) by 492 days.

This patent is subject to a terminal disclaimer.

(21) Appl. No.: 11/098,595

(22) Filed: Apr. 4, 2005

(65) Prior Publication Data

US 2005/0271179 A1 Dec. 8, 2005

Related U.S. Application Data

(63) Continuation of application No. PCT/JP03/12093, filed on Sep. 22, 2003.

(30) Foreign Application Priority Data

Oct. 4, 2002 (JP) ............................. 2002-292770

(51) Int. Cl.
*G06F 11/00* (2006.01)
*G01R 31/28* (2006.01)
*G11B 20/20* (2006.01)

(52) U.S. Cl. ................... 714/744; 714/731; 714/700

(58) Field of Classification Search ................. 714/700, 714/731, 744, 798
See application file for complete search history.

(56) References Cited

U.S. PATENT DOCUMENTS 6,182,233 B1 * 1/2001 Schuster et al. ............. 713/400
6,477,674 B1 * 11/2002 Bates et al. ................. 714/738
6,629,274 B1 * 9/2003 Tripp et al. ................. 714/721
6,696,862 B2 * 2/2004 Choi et al. .................... 326/93
6,715,096 B2 * 3/2004 Kuge .......................... 713/600
6,789,224 B2 * 9/2004 Miura ......................... 714/744
6,973,103 B2 * 12/2005 Hayashi et al. ............. 370/516
6,990,613 B2 * 1/2006 Doi et al. .................... 714/700

(Continued)

FOREIGN PATENT DOCUMENTS

JP 2001-27660 1/2001

(Continued)

OTHER PUBLICATIONS

IBM Technical Disclosure Bulletin, NN8006328 Zero Delay Set Reset Latch with Edge-Triggered Strobe Control. Jun. 1980 vol. 23 Issue 1 pp. 328-329.*

(Continued)

*Primary Examiner*—Cynthia Britt
(74) *Attorney, Agent, or Firm*—Osha • Liang LLP

(57) ABSTRACT

A multi-strobe generation apparatus for generating a multi-strobe has a plurality of strobes. The multi-strobe generation apparatus includes a shift clock generating section which outputs a shift clock generated by dividing a reference clock at a timing at which each strobe is generated, a strobe generating section for generating the multi-strobe corresponding to each leading or trailing edge of the reference clock, and an adjustment section for adjusting timing at which the strobe generating section generates each strobe based on the shift clock.

20 Claims, 11 Drawing Sheets

U.S. PATENT DOCUMENTS 7,010,729 B2 * 3/2006 Doi et al. .................... 714/700

FOREIGN PATENT DOCUMENTS

| JP | 2001-201532 | 7/2001 |
| JP | 2001-356153 | 12/2001 |
| JP | 2002-365345 | 12/2002 |
| JP | 2003-149304 | 5/2003 |
| JP | 2003-149305 | 5/2003 |
| JP | 2004-125573 | 4/2004 |

OTHER PUBLICATIONS

Japanese Office Action for patent application No. 2002-292770, issued Feb. 6, 2007, and English translation thereof, 5 pages.

English Patent Abstract of JP2004125573, from esp@cenet, published Apr. 22, 2004, 1 page.

Patent Abstracts of Japan, Publication No. 2001-356153, Publication Date: Dec. 26, 2001, 1 page.

Patent Abstracts of Japan, Publication No. 2001-201532, Publication Date: Jul. 27, 2001, 1 page.

Patent Abstracts of Japan, Publication No. 2003-149305, Publication Date: May 21, 2003, 1 page.

Patent Abstracts of Japan, Publication No. 2003-149304, Publucation Date: May 21, 2003, 1 page.

Patent Abstracts of Japan, Publication No. 2001-027660, Publication Date: Jan. 30, 2001, 1 page.

Patent Abstracts of Japan, Publication No. 2002-365345, Publication Date: Dec. 18, 2002, 1 page.

International Search Report for International Application No. PCT/JP03/12093 mailed on Jan. 20, 2004, 2 pages.

* cited by examiner

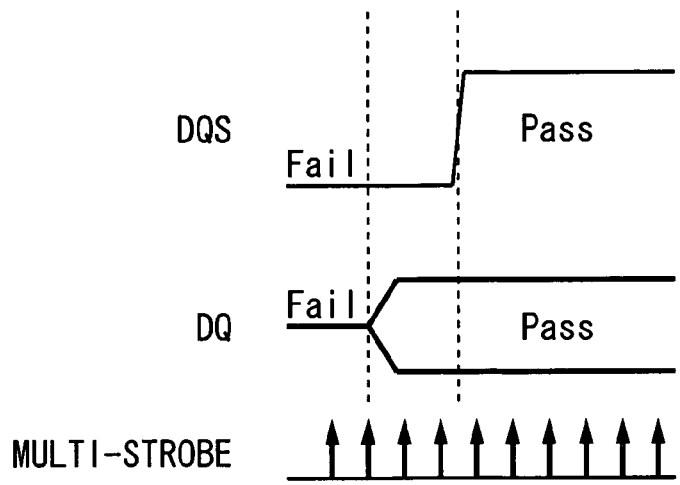
FIG. 2A
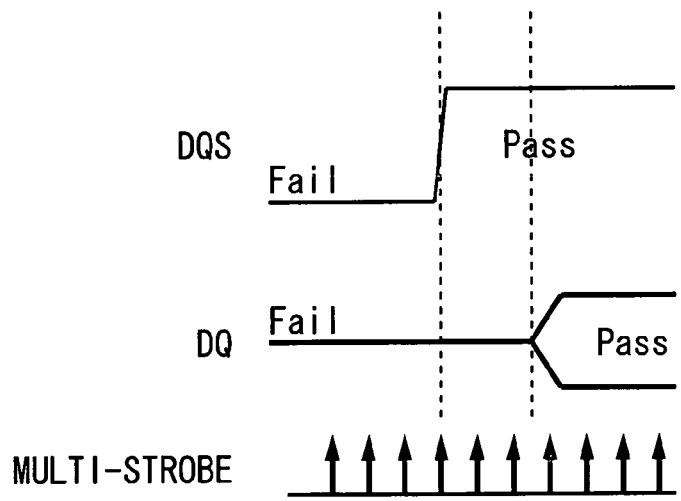
FIG. 2B
| DQS JUDGMENT | DQ JUDGMENT | TABLE JUDGMENT |
|---|---|---|
| Pass | Pass | Pass |
| Pass | Fail | Fail |
| Fail | Pass | Pass |
| Fail | Fail | Pass |
FIG. 2C

| D6 | D5 | D4 | D3 | D2 | D1 | D0 |
|---|---|---|---|---|---|---|
| POSITIVE-NEGATIVE JUDGING BIT | GLITCH DETECTING BIT | STROBE NO. DATA ||||||

MULTI-STROBE GENERATION APPARATUS, TEST APPARATUS AND ADJUSTMENT METHOD

The present application is a continuation application of PCT/JP03/12093 filed on Sep. 22, 2003, claiming priority from a Japanese Patent application No. 2002-292770 filed on Oct. 4, 2002, the contents of which are incorporated herein by reference.

BACKGROUND OF THE INVENTION

1. Field of the Invention

The present invention relates to a multi-strobe generation apparatus for generating a multi-strobe having a plurality of strobes, a test apparatus for testing electronic devices and an adjustment method for adjusting timing for generating each strobe of the multi-strobe. Specifically, the invention relates to a multi-strobe generation apparatus for controlling the timing for generating the respective strobes.

2. Description of Related Art

Conventionally, a change point or the like of value of a signal to be measured is detected by outputting one strobe while delaying per cycle of the signal to be measured and by detecting the value of the signal to be measured in each strobe. This method is used to detect a change point or the like of value of a data signal and a DQS signal in a setup/hold test or the like of a memory for example.

A double data rate type device such as a DDR-SDRAM (Double Data Rate-SDRAM) that outputs a data signal in synchronism with a leading or trailing edge of a clock (DQS) outputs clock following to the data signal per predetermined output data width. Thereby, the setup/hold timing condition in passing data is relaxed. Such a device is required to have a predetermined setup time and hold time between the data signal and the clock in order to set up/hold the data without error.

Conventionally, the value of the data signal and the value of the clock are detected by one strobe, respectively, to detect change points of the respective values. Then, it is judged pass/fail of the tested device by judging whether or not the respective change points thus detected satisfy the predetermined setup time and hold time.

However, because the values are detected per each cycle of the data signal and DQS by one strobe, it is unable to test accurately when jitter occurs in the data signal and DQS due to various factors such as fluctuation of power and thermal fluctuation of the device. Still more, it takes time for the test because the data signal and DQS are scanned by one strobe.

SUMMARY OF INVENTION

It is therefore an object of the invention to provide a multi-strobe generation apparatus, a test apparatus and an adjustment method capable of solving the above-mentioned problems. This object may be achieved by combining features described in independent claims of the invention. Dependent claims specify further preferable embodiments of the invention.

According to a first aspect of the present invention, there is provided a multi-strobe generation apparatus for generating a multi-strobe having a plurality of strobes, including: a shift clock generating section outputting a shift clock generated by dividing a reference clock at a timing at which each strobe is generated; a strobe generating section for generating the multi-strobe corresponding to each leading or trailing edge of the reference clock; and an adjustment section for adjusting timing at which the strobe generating section generates each strobe based on the shift clock.

Preferably, the adjustment section adjusts the timing of each strobe based on a value of the shift clock of each strobe in the multi-strobe by which a change point of the value of the shift clock is detected among the multi-strobes generated by the strobe generating section.

Preferably, the shift clock generating section generates the shift clocks sequentially in correspondence to a plurality of timings at which the plurality of strobes is to be generated and the adjustment section adjusts the timing at which the strobe generating section generates the corresponding strobes based on the respective shift clocks generated in correspondence to the plurality of timings.

The strobe generating section may have a plurality of cascade-connected variable delay circuits that receives strobe signals, delays the received strobe signals by a predetermined time and outputs them sequentially as the strobes; and the adjustment section may adjust the delay time of the variable delay circuit sequentially based on each shift clock.

The multi-strobe generation apparatus may be provided further with a plurality of comparators, provided respectively in correspondence to any one of the variable delay circuits, for comparing the timing of the strobe output by the corresponding variable delay circuit with the timing of the shift clock; and the adjustment section may adjust the delay time in each variable delay circuit based on the comparison result of the corresponding comparator.

Preferably, the adjustment section changes delay time of the variable delay circuit which is to adjust the delay time and sets the delay time of the variable delay circuit to be adjusted at delay time when the comparator judges that the timing of the strobe output by the variable delay circuit to be adjusted almost coincides with the timing of the shift clock.

Preferably, the variable delay circuit outputs the strobes by plural times per each delay time changed by the adjustment section, the shift clock generating section generates the shift clock whose value changes at the timing when the variable delay circuit to be adjusted is to output the strobe by plural times; the comparator detects the value of the shift clock by using the strobe output by the plural times and the adjustment section has a change-point detector for judging the strobe by which the change point of the value of the shift clock generated by the plural times is detected based on the comparison result of the comparator and sets the delay time of each variable delay circuit based on the judgment result of the change-point detector.

The adjustment section may set the delay time of the variable delay circuit outputting a first strobe so that a number of times when a second strobe next to the first strobe detects the change point is almost a half of a number of times when the shift clock is generated and so that a number of times when a third strobe next to the second strobe detects the change point is zeroed in setting the timing of the first strobe indicating the initial strobe in the multi-strobe by which the change point is detected.

Still more, the adjustment section may set the delay time of the variable delay circuit outputting the second strobe so that a number of times when the second strobe detects the change point is almost equal to a number of times when the third strobe detects the change point in setting the timing of the second strobe in the multi-strobe by which the change point is detected.

Preferably, the change-point detector encodes the comparison result of the comparator and generates encode data indicating No. of the strobe by which the change point is detected in the multi-strobe per the multi-strobe.

The change-point detector may also generate the encode data indicating whether or not the corresponding multi-strobe has detected the change point per multi-strobe.

Still more, the change-point detector may generate the encode data further indicating whether the corresponding multi-strobe has detected glitch in the shift clock per every multi-strobe.

The adjustment section may also have an encode memory for storing the encode data generated by the change-point detector.

The adjustment section may also have a first change-point coincidence comparing circuit for judging whether or not each of the encode data indicates that the change point has been detected by one the strobe and a second change-point coincidence comparing circuit for judging whether or not each of the encode data indicates that the change point has been detected by the strobe next to the one strobe. The delay time of the variable delay circuit outputting the one strobe may be set so that a number of times when the first change-point coincidence comparing circuit judges that the change point has been detected by the one strobe is almost equalized with a number of times when the second change-point coincidence comparing circuit judges that the change point has been detected in the next strobe.

The first change-point coincidence circuit may have a first comparison memory for storing first comparison data indicating No. of the one strobe in the multi-strobe and a first detected-position comparator for judging whether or not the Strobe No. data in the encode data indicating No. of the strobe by which the change point has been detected coincides with the first comparison data; and the second change-point coincidence circuit may have a second comparison memory for storing second comparison data indicating No. of the next strobe in the multi-strobe and a second detected-position comparator for judging whether or not the Strobe No. data in the encode data indicating No. of the strobe by which the change point has been detected coincides with the second comparison data.

Still more, the first detected-position comparator may have a plurality of first exclusive OR circuits outputting logic H when the respective bits composing the first comparison data coincides with the bits of the corresponding Strobe No. data, a first AND circuit for outputting AND of the respective outputs of the exclusive OR circuit and a first counter outputting the number of times when the AND circuit outputs logic H as a number of times when the change point has been detected by the one strobe; and the second detected-position comparator may have a second exclusive OR circuit outputting logic H when the respective bits composing the second comparison data coincides with the bits of the corresponding strobe No. data, a second AND circuit for outputting AND of the respective outputs of the exclusive OR circuit; and a second counter outputting the number of times when the AND circuit outputs logic H as a number of times when the change point has been detected by the next strobe.

According to a second aspect of the present invention, there is provided a test apparatus for testing electronic devices, having: a pattern generator for generating a test pattern for testing the electronic device; a pattern formatter for formatting the test pattern to supply to the electronic device; and a judging device for judging pass/fail of the electronic device based on an output signal output by the electronic device corresponding to the test pattern; wherein the judging device has a multi-strobe generation apparatus for generating a multi-strobe having a plurality of strobes for detecting a value of the output signal; and the multi-strobe generation apparatus has a shift clock generating section outputting a shift clock generated by dividing a reference clock at a timing at which each strobe is generated; a strobe generating section for generating the multi-strobe corresponding to each leading or trailing edge of the reference clock; and an adjustment section for adjusting timing at which the strobe generating section generates each strobe based on the shift clock.

According to a third aspect of the present invention, there is provided an adjustment method for adjusting timing for generating each strobe of a multi-strobe having the plurality of strobes, having: a shift clock generating step for generating a shift clock generated by dividing a reference clock at a timing at which each strobe is generated; a strobe generating step for generating the multi-strobe corresponding to each leading or trailing edge of the reference clock; and an adjustment step for adjusting timing at which the strobe generating section generates each strobe based on the shift clock.

It is noted that the summary of the invention does not necessarily describe all necessary features of the invention. The invention may also be a sub-combination of the features described above.

BRIEF DESCRIPTION OF THE DRAWINGS

FIGS. 2A through 2C are charts and a table for explaining one example of a setup test of a DDR-SDRAM, wherein FIGS. 2A and 2B show one example of timing charts of DQ and DQS and FIG. 2C shows one example of a table for judging pass/fail of the DDR-SDRAM.

FIGS. 6A and 6B are charts for explaining the strobe adjustment method, wherein FIG. 6A shows the adjustment method of a first strobe and FIG. 6B shows the adjustment method of a second strobe.

FIGS. 8A and 8B show one example of data structure of encode data, wherein FIG. 8A shows a relationship between a comparison result of a comparator and the encode data and FIG. 8B shows the data structure of the encode data.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
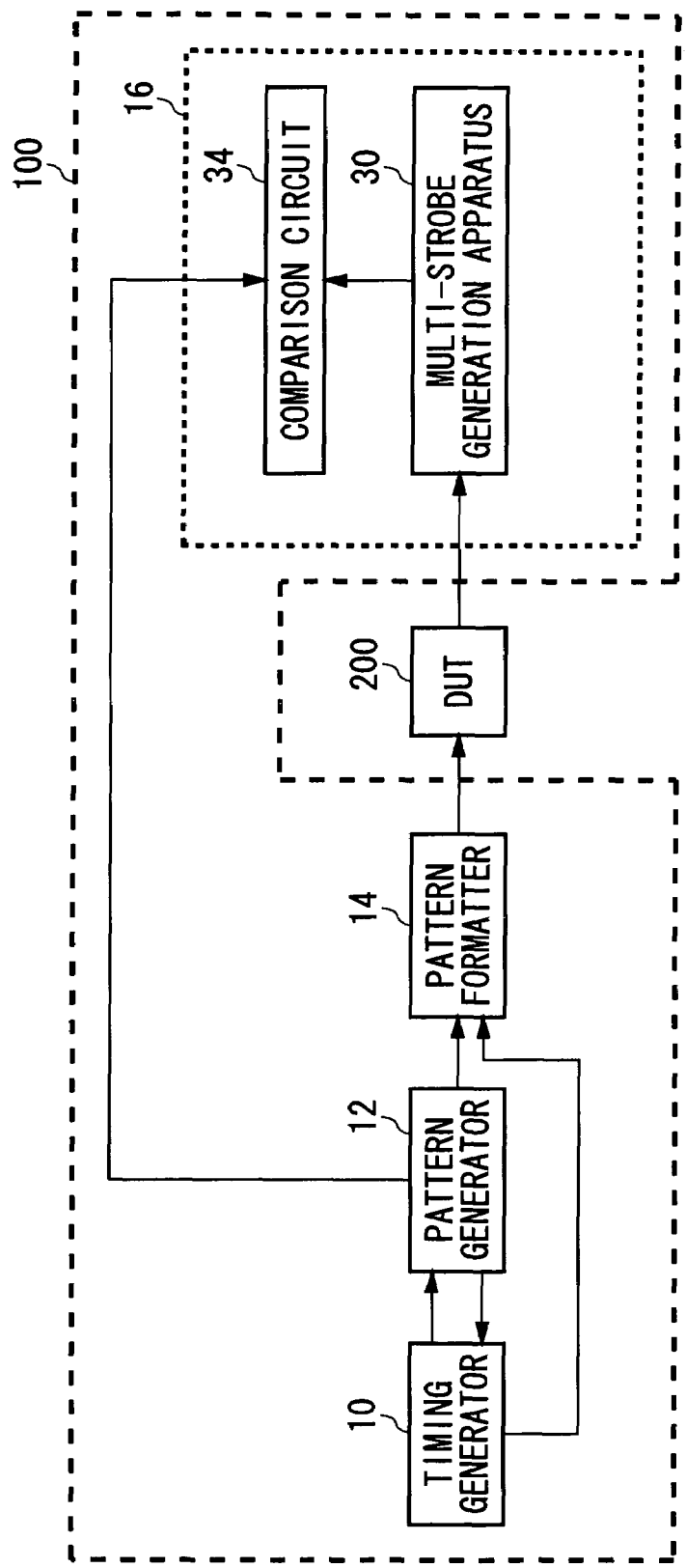
FIG. 1 is a diagram showing one exemplary configuration of a test apparatus of the invention.

FIG. 1 is a diagram showing one exemplary configuration of a test apparatus 100 according to an embodiment of the invention. The test apparatus 100 tests electronic devices 200 by detecting a value of an output signal of the electronic device 200 by using a multi-strobe having a plurality of strobes.

The test apparatus 100 has a timing generator 10, a pattern generator 12, a pattern formatter 14 and a judging device 16. The timing generator 10 generates a timing signal for operating the test apparatus 100. For instance, the timing generator 10 receives a test set signal specifying timing for supplying a test pattern to the electronic device 200 from the pattern generator 12 and supplies a signal specifying the timing for supplying the test pattern to the electronic device 200 to the pattern formatter 14. The timing generator 10 also generates a reference clock for synchronizing operations of the test apparatus 100 and supplies it to each component of the test apparatus 100.

The pattern generator 12 generates the test pattern for testing the electronic device 200 and supplies it to the pattern formatter 14. The pattern formatter 14 formats the test pattern received from the pattern generator 12 and supplies the formatted test pattern to the electronic device 200 in response to the signal received from the timing generator 10.

The judging device 16 judges pass/fail of the electronic device 200 based on the output signal output from the electronic device 200 in response to the test pattern supplied thereto. The judging device 16 has a multi-strobe generation apparatus 30 for generating a multi-strobe having a plurality of strobes and detecting a value of the output signal of the electronic device 200 by the generated multi-strobe and a comparison circuit 34 for judging pass/fail of the electronic device 200 based on the value of the output signal detected by the multi-strobe generation apparatus 30. The pattern generator 12 supplies an expected-value signal to be output by the electronic device 200 to the comparison circuit 34 and the comparison circuit 34 judges pass/fail of the electronic device 200 by comparing the expected-value signal with the value of the output signal.

The electronic device 200 may be a DDR-SDRAM for example and the judging device 16 may receive, as the output signal, a data signal of the DDR-SDRAM and DQS which is a clock signal output in synchronism with the data signal. In this case, the judging device 16 may carry out the setup/hold test of the electronic device 200 based on the received data signal and DQS to judge pass/fail of the electronic device 200.

FIGS. 2A through 2C are charts and a table for explaining one example of the setup test of the DDR-SDRAM. Here, the test apparatus 100 carries out the setup test of the electronic device 200 by detecting values of the DQS and data signal, respectively, by the multi-strobe. While the DDR-SDRAM outputs the DQ and DQS so that their leading edges almost coincide each other, the test apparatus 100 detects the respective values by shifting timing for generating the multi-strobe for detecting the value of the DQ from timing for generating the multi-strobe for detecting the value of the DQS by a predetermined offset. For example, the test apparatus 100 may shift the timing for generating the multi-strobe for the DQ by a degree shifted by a memory controller used in actually using the DDR-SDRAM that shifts the DQS with respect to the DQ.

The test apparatus 100 judges pass/fail of the DDR-SDRAM based on whether or not the DDR-SDRAM outputs the DQ having a predetermined value. FIGS. 2A and 2B show one example of timing charts of the DQ and DQS. In the example shown in FIG. 2A, the DQ shows the predetermined value at the change point of the value of the DQS, so that the test apparatus 100 judges pass/fail of the DDR-SDRAM. In the example shown in FIG. 2B, the DQ does not show the predetermined value at the change point of the value of DQS, so that the test apparatus 100 judges that the DDR-SDRAM is defective.

The test apparatus 100 of the present embodiment compares the DQS and DQ with the predetermined value in each strobe of the multi-strobe and converts the DQS and DQ into a Pass/Fail signal corresponding to the comparison result. That is, the test apparatus 100 judges pass/fail of the DDR-SDRAM by means of table judgment as shown in FIG. 2C whether the DQS and DQ show Pass or Fail.

The test apparatus 100 of the present embodiment can test the DDR-SDRAM accurately even when delay time of the DQ and DQS varies per cycle because the test apparatus 100 detects the values by the multi-strobe having the plurality of strobes for one cycle of the DQ and DQS. The test apparatus 100 can test the DDR-SDRAM in the same manner also in a hold test thereof.

Figure 3:
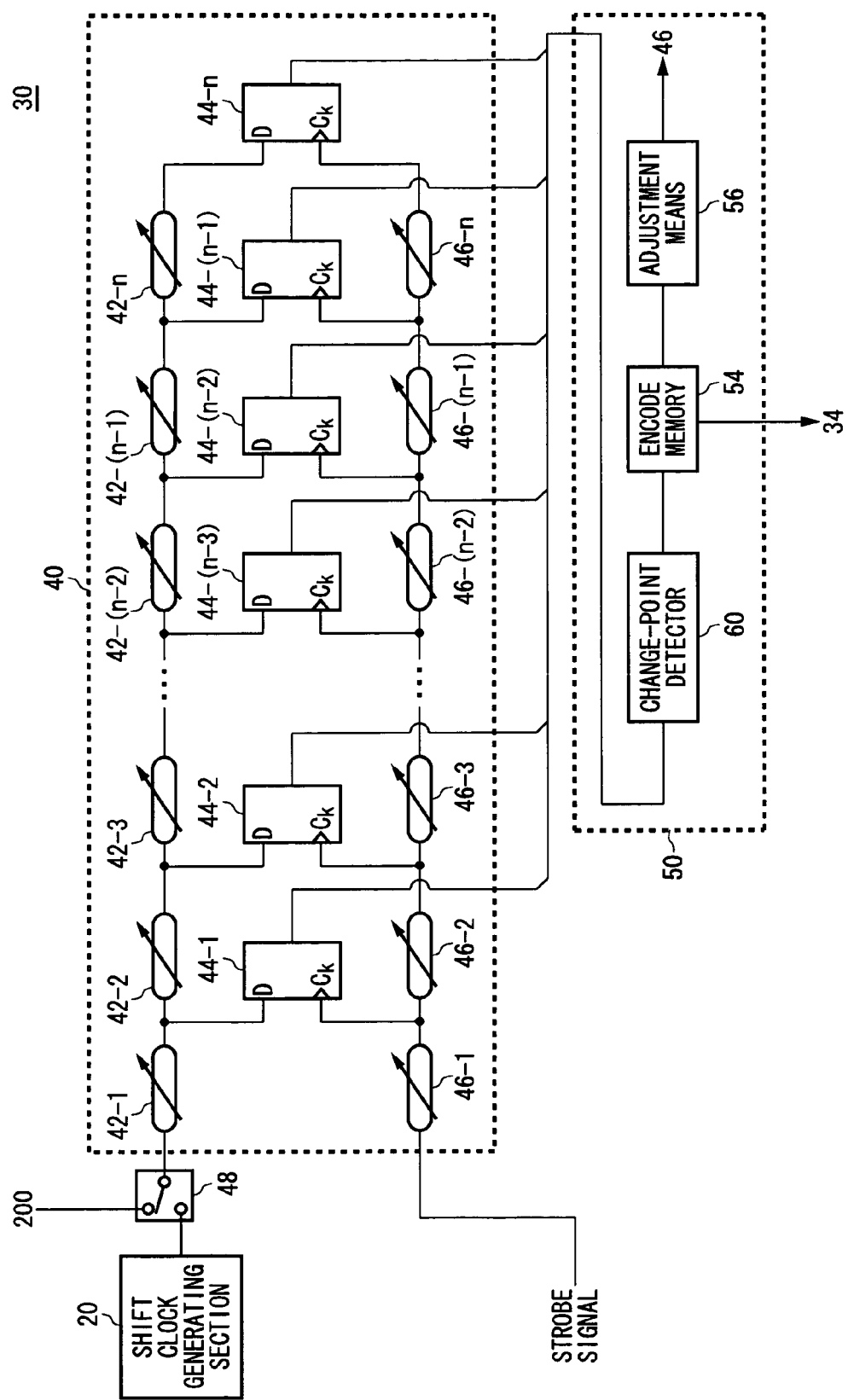
FIG. 3 is a diagram showing one exemplary configuration of a multi-strobe generation apparatus.

FIG. 3 is a diagram showing one exemplary configuration of the multi-strobe generation apparatus 30. The multi-strobe generation apparatus 30 generates the multi-strobe having a plurality of strobes. The multi-strobe generation apparatus 30 is provided with a shift clock generating section 20, a switch 48, a strobe generating section 40 and an adjustment section 50. A strobe signal for generating the strobe is supplied to the strobe generating section 40. The strobe signal may be generated by the timing generator 10 for example.

The strobe generating section 40 has a plurality of cascade-connected delay elements 42, a plurality of comparators 44 and a plurality of cascade-connected variable delay circuits 46. The plurality of variable delay circuits 46 receives the strobe signal and delays the received strobe signal by a predetermined time to sequentially output as strobes, respectively, and to generate the multi-strobe. The plurality of delay elements 42 supplies the output signal of the electronic device 200 to the comparators 44. The plurality of comparators 44 is provided in correspondence to any one of the variable delay circuits 46, respectively, and receives the strobe output by the corresponding variable delay circuit 46 and the output signal of the electronic device 200 to detect the value of the output signal by the received strobe.

The plurality of delay elements 42 is provided corresponding to any one of the plurality of variable delay circuits 46, respectively, receives the comparison result of the comparator 32 and delays the received comparison result sequentially by a predetermined time to supply to the corresponding comparator 44. The respective delay elements 42 delay the received comparison result by the offset delay of the corresponding variable delay circuit 46.

Here, the offset delay is the magnitude of delay caused when a route of generating the least delay is selected in the variable delay circuit. For instance, the offset delay is the magnitude of delay caused when a route not delaying the signal is selected in the variable delay circuit. That is, the offset delay indicates an error between a delay set value and a delay time in the variable delay circuit 46. The error of the delay time in the variable delay circuit 46 may be reduced by supplying the received signal to the comparator 44 while delaying by the magnitude of offset delay of the corresponding variable delay circuit 46.

Each of the delay element 42 has almost identical characteristics with the corresponding variable delay circuit 46 and is an adjusting variable delay circuit wherein the magnitude of delay of each offset delay route is almost the same with the magnitude of delay of the offset delay route of the corresponding variable delay circuit 46. Using the offset delay route of the adjusting variable delay circuit, the delay element 42 delays the received signal by the offset delay of the corresponding variable delay circuit 46. Here, the offset delay route is the route that causes least delay in the variable delay circuit.

For instance, the delay element 42 is formed by the same material and through the same process with the corresponding variable delay circuit 46. Using the adjusting variable delay circuit that has the identical characteristics with the corresponding variable delay circuit 46 as the delay element 42 allows the same delay with the offset delay in the variable delay circuit 46 to be generated accurately. Still more, even if the offset delay in the variable delay circuit 46 fluctuates due to temperature change and others, the fluctuation may be absorbed by using the delay element 42 having the identical characteristics.

The comparator 44 detects the value of the signal output by the delay element 42 at the timing of the strobe received from the corresponding variable delay circuit 46 and supplies the detected value to the comparison circuit 34 (see FIG. 1) via the adjustment section 50. The comparison circuit 34 compares the value received from the comparator 44 with the expected-value signal generated by the pattern generator 12. The judging device 16 explained in connection with FIG. 1 judges pass/fail of the electronic device 200 based on the comparison result in the comparison circuit 34.

The test apparatus 100 judges pass/fail of the electronic device 200 by detecting the value of the output signal of the electronic device 200 by the multi-strobe through the operations described above. Still more, when the multi-strobe generation apparatus 30 detects the value of the output signal as described above, the switch 48 connects the strobe generating section 40 with output pins of the electronic device 200. Next, adjustment of the timing for generating the plurality of strobes of the multi-strobe generation apparatus 30 will be explained.

In adjusting the timing for generating the plurality of strobes, the switch 48 connects the shift clock generating section 20 with the strobe generating section 40. The shift clock generating section 20 outputs a shift clock generated by dividing a given reference clock. For instance, the shift clock generating section 20 has a frequency divider for dividing the reference clock to generate the shift clock and a variable delay circuit for delaying the shift clock to output the shift clock while delaying accurately. The shift clock generating section 20 outputs the shift clock at the timing that turns out to be the reference of the strobes generated by the multi-strobe generation apparatus 30. Then, the strobe generating section 40 adjusts the timing for generating the strobes by matching it with the timing of the shift clock. This adjustment may be made by using either the timing of the leading edge or the timing of the trailing edge of the shift clock.

The shift clock generating section 20 also outputs a shift clock asynchronous to the reference clock. The test apparatus 100 is also provided with a variable delay circuit for adjusting a phase of the strobe signal preceding to the variable delay circuit 46-1. The variable delay circuit matches the phase of the shift clock output by the shift clock generating section 20 with that of the strobe signal by delaying the strobe signal.

Then, the shift clock generating section 20 outputs a shift clock for setting a delay in the first-stage variable delay circuit 46-1 among the cascaded-connected variable delay circuits 46. That is, it outputs the shift clock whose value changes at the timing corresponding to the delay to be set in the variable delay circuit 46-1. The shift clock is delayed by the plurality of delay elements 42 by almost the same delay with the offset delay of the variable delay circuit 46 and is supplied to the comparator 44.

Each comparator 44 detects the value of the shift clock by using the strobe output by the corresponding variable delay circuit 46 and supplies the detected result to the adjustment section 50. Here, the strobe generating section 40 receives the strobe signal corresponding to the leading or the trailing edge of each reference clock divided by the shift clock generating section 20 and generates the multi-strobe corresponding to the received strobe signal. For instance, when the shift clock generating section 20 generates the shift clock by dividing the reference clock by 16, the strobe signals are given to the strobe generating section 40 by 16 times within one frequency of the shift clock. Thereby, the change point of the value of the shift clock may be detected by any one of the multi-strobe.

The adjustment section 50 adjusts the timing by which the strobe generating section 40 generates the respective multi-strobes based on the shift clock generated by the shift clock generating section 20. In the present embodiment, the adjustment section 50 adjusts the timing of each strobe based on a value of the shift clock at each strobe of the multi-strobe by which the change point of the value of the shift clock has been detected among the multi-strobes generated by the strobe generating section 40. That is, the adjustment section 50 adjusts the timing of each strobe by matching the timing of the strobe to be adjusted with the change point of the value of the shift clock.

The shift clock generating section 20 generates the shift clocks sequentially at a plurality of timings by which a plurality of strobes is to be generated. The adjustment section 50 adjusts the timing by which the strobe generating section 40 generates each strobe by setting the delay time of all the variable delay circuits 46 sequentially from the first-stage variable delay circuit 46 in the same manner based on the respective shift clocks generated at the plurality of timings.

The adjustment section 50 has a change-point detector 60, an encode memory 54 and adjustment means 56. The change-point detector 60 generates encode data that specifies the strobe of the multi-strobe by which the change point of the value of the shift clock has been detected based on the comparison result of the plurality of comparators 44.

The encode memory 54 stores the encode data generated by the change-point detector 60. Based on the encode data stored in the encode memory 54, the adjustment means 56 sets the delay time of the respective variable delay circuits 46. A method for setting the delay time will be explained later in detail.

Figure 4:
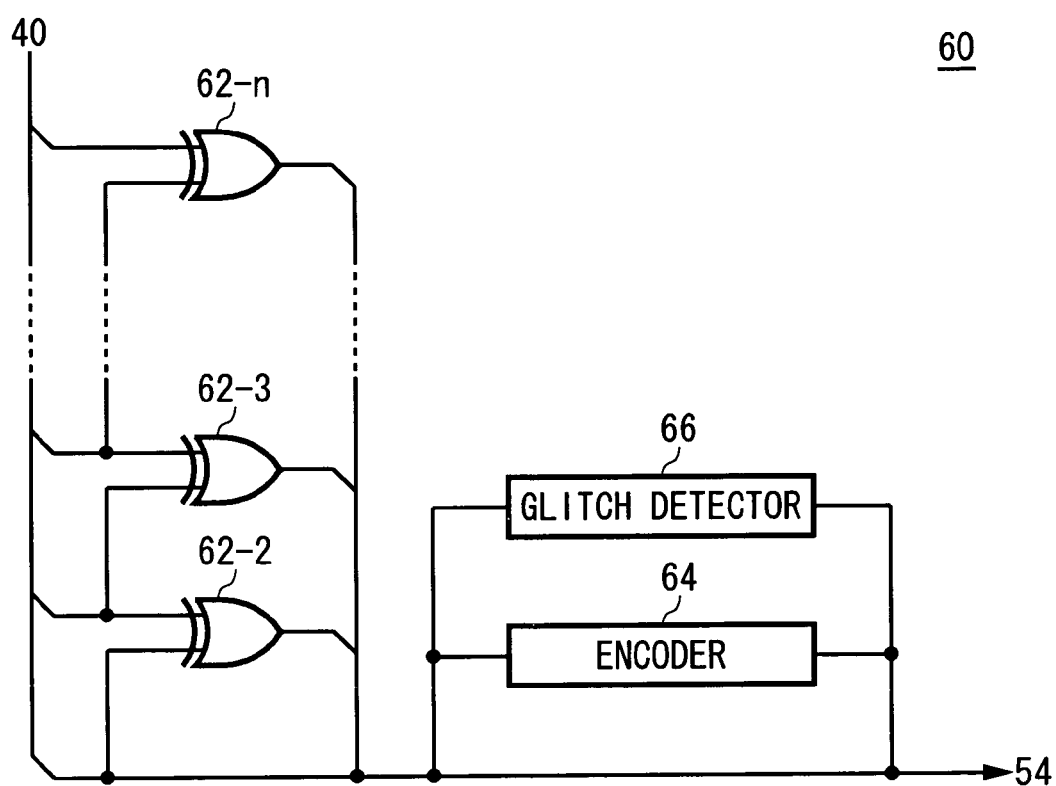
FIG. 4 is a diagram showing one exemplary configuration of a change-point detector.

FIG. 4 is a diagram showing one exemplary configuration of the change-point detector 60. The comparator 44 explained with reference to FIG. 3 outputs 1 when the detected value of the shift clock is on H level and outputs 0 when it is on L level. The change-point detector 60 has a plurality of exclusive OR circuits 62 provided in correspondence to the comparators 44, a glitch detector 66 and an encoder 64.

The plurality of exclusive OR circuits 62 receives the comparison result of the corresponding comparator 44 and the comparison result of the pre-stage comparator 44 of the corresponding comparator 44 and outputs their exclusive OR. That is, the respective exclusive OR circuits 62 output 1, assuming that a change point is detected in the corresponding strobe, when the comparison result of the corresponding comparator 44 and the comparison result of the pre-stage comparator 44 of the corresponding comparator 44 are different.

Based on the outputs of the plurality of exclusive OR circuits 62, the glitch detector 66 detects whether or not glitch exists in the output signal of the electronic device 200 or in the shift clock within a range detected by one multi-strobe. That is, when the plurality of exclusive OR circuits 62 outputs 1, the glitch detector 66 determines that there exists glitch in the output signal of the electronic device 200 or in the shift clock. The comparison circuit 34 (see FIG. 1) may judge pass/fail of the electronic device also based on the detected result of the glitch detector 66.

Based on the output of the plurality of exclusive OR circuits 62, the encoder 64 generates encode data specifying the strobe in the multi-strobe by which the change point of the value of the shift clock has been detected. That is, the encoder 64 generates the encode data based on the exclusive OR circuit 62 that has output 1. For instance, when the second exclusive OR circuit 62-2 has output 1, the encoder 64 outputs a binary number specifying 2 as the encode data. Data structure of the encode data will be described later.

Figure 5:
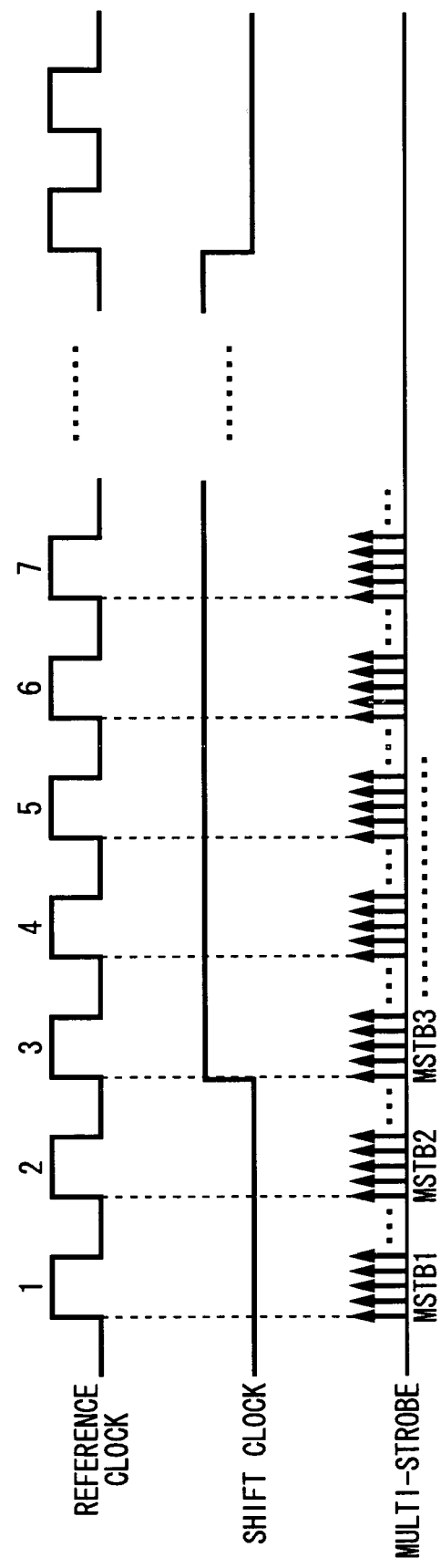
FIG. 5 is a chart for explaining a strobe adjustment method.

FIG. 5 is a chart for explaining a strobe adjustment method. The shift clock generating section 20 generates the shift clock by dividing the frequency of the reference clock as described before. The strobe generating section 40 generates multi-strobes corresponding to respective leading or each trailing edges of the reference clock as shown in FIG. 5.

In the respective multi-strobes, the comparator 44 detects the value of the shift clock in the corresponding strobe. Based on the comparison result of the comparator 44, the change-point detector 60 generates the encode data for the respective multi-strobes. Based on the encode data of the multi-strobes by which the change point has been detected, the adjustment means 56 sets the delay of the variable delay circuit 46.

Figure 6A:
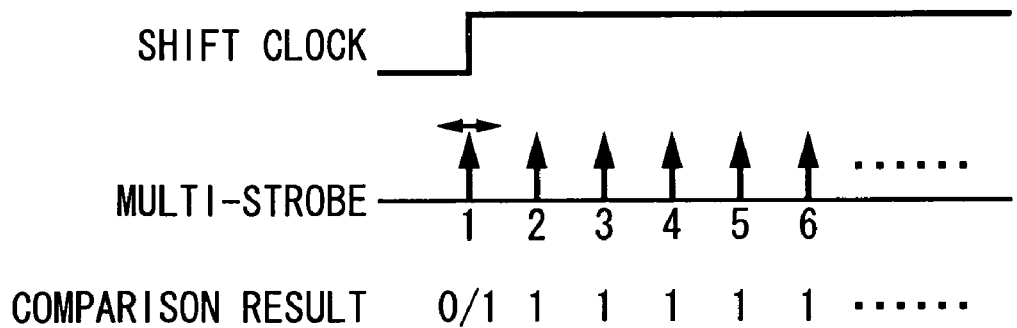
Figure 6B:
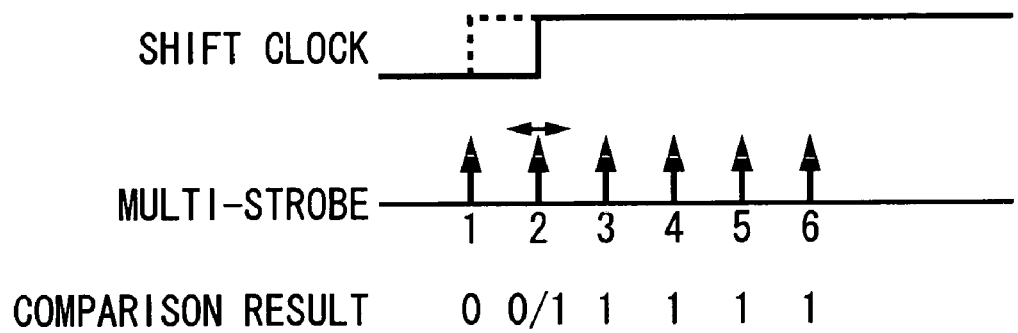

FIGS. 6A and 6B are charts for explaining the strobe adjustment method. The adjustment section 50 adjusts the timing of each strobe based on the multi-strobe by which the change point of the value of the shift clock has been detected among the multi-strobes. That is, the adjustment section 50 changes the delay time of the variable delay circuit 46 that is to adjust the delay time based on the encode data of the multi-strobe by which the change point of the value of the shift clock has been detected and sets the delay time of the variable delay circuit 46 to be adjusted at the delay time judged by the comparator 44 that the timing of the strobe output by the variable delay circuit 46 to be adjusted almost coincides with the timing of the shift clock.

As shown in FIG. 6A, the adjustment section 50 adjusts the timing of the first strobe at first and then sequentially adjusts the timing of the next strobe and after as shown in FIG. 6B.

For instance, the adjustment section 50 sequentially changes the delay time of the variable delay circuit 46 to be adjusted and sets the delay time of the variable delay circuit 46 to be adjusted at the delay time judged by the comparator 44 that the timing of the strobe output by the variable delay circuit 46 to be adjusted almost coincides with the timing of the shift clock. For instance, the adjustment means 56 sequentially changes the delay time of the variable delay circuit 46 and the shift clock generating section 20 outputs the shift clock every time when the adjustment section 50 changes the delay time of the variable delay circuit 46. The adjustment section 50 carries out these processes to the respective variable delay circuits 46.

The shift clock generating section 20 may also output the shift clocks by plural times every time when the adjustment means 56 changes the delay time of the variable delay circuit 46 to be adjusted. In this case, the strobe signal is given to the respective variable delay circuits 46 by plural times corresponding to the shift clocks and the respective variable delay circuits 46 output strobes by plural times. The comparator 44 detects each value of the corresponding shift clock by each strobe. The change-point detector 60 generates encode data based on the comparison result of the comparator 44 and the encode memory 54 stores the obtained encode data by correlating with the delay time of the variable delay circuit 46 to be adjusted.

That is, the variable delay circuit 46 outputs the strobes by plural times per each delay time changed by the adjustment section 50 and the shift clock generating section 20 generates the shift clock whose value changes at the timing when the variable delay circuit 46 to be adjusted outputs the strobe by plural times, the comparator 44 detects the value of the shift clock by using the strobe output by the plural times and the change-point detector 60 judges the strobe by which the change point of the value of the shift clock generated by the plural times is detected on the basis of the comparison result of the comparator 44 to set the delay time of each variable delay circuit 46 based on the result judged by the change-point detector 60.

Figure 7:
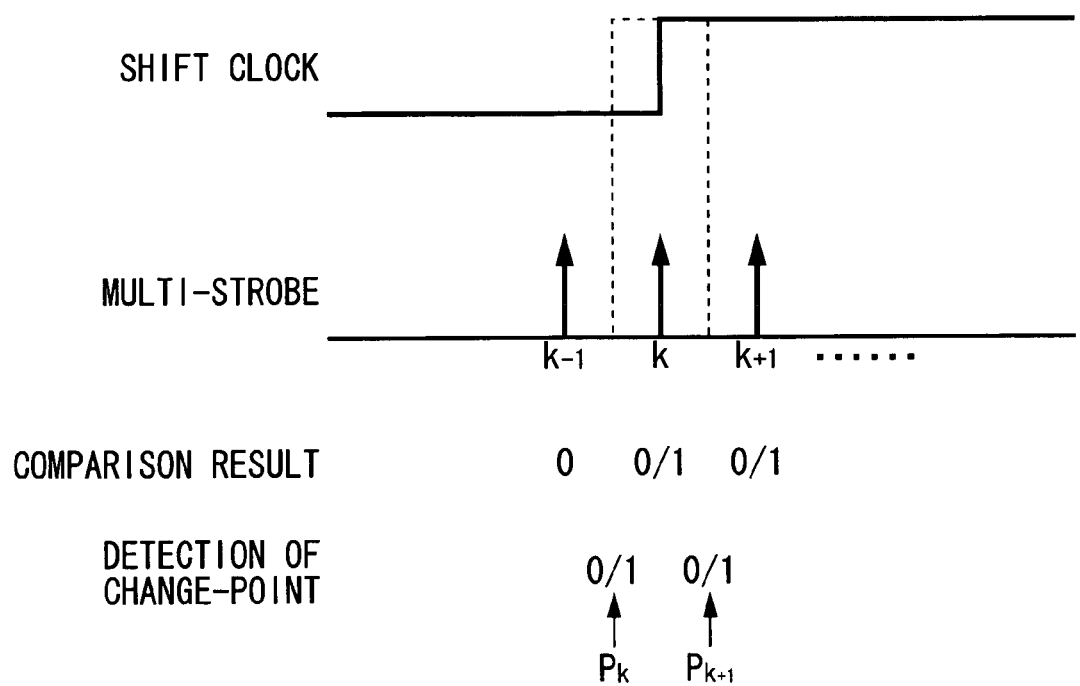
FIG. 7 is a chart for explaining the strobe adjustment method when a shift clock generating section outputs shift clocks by plural times.

FIG. 7 is a chart for explaining the strobe adjustment method when the shift clock generating section 20 outputs shift clocks by plural times. At first, a case of adjusting the timing of a k-th strobe in a multi-strobe will be explained.

In adjusting the timing of the k-th strobe, the adjustment section 50 sets the delay time of the variable delay circuit 46-$k$ based on the comparison result of the comparator 44-($k$−1), comparator 44-$k$ and comparator 44-($k$+1). In the present embodiment, in setting the timing of the k-th strobe (second strobe) in the multi-strobe by which the change point is detected, the adjustment section 50 sets the delay time of the variable delay circuit 46-1 that outputs the k-th strobe so that a number of times when the k-th strobe detects the change point is almost equalized with a number of times when the k+1-th strobe (third strobe) detects the change point. Here, detecting the change point by the k-th strobe means that the comparison result of the comparator 44-($k$−1) is different from the comparison result of the comparator 44-$k$.

That is, the adjustment means 56 sets the delay time of the variable delay circuit 46-$k$ at the delay time by which a number $P_k$ of the encode data indicating that the k-th strobe has detected the change point almost coincides with a number $P_{k+1}$ of the encode data indicating that the k+1-th strobe has detected the change point among the plurality of encode data stored in the encode memory 54 by correlating with each delay time of the variable delay circuit 46.

Still more, in setting timing of the first strobe indicating the initial strobe of the multi-strobe by which the change point has been detected, the adjustment section 50 sets the delay time of the variable delay circuit 46-1 that outputs the first strobe so that a number of times when the second strobe next to the first strobe detects the change point is almost a half of number of times of generation of the shift clocks and so that a number of times when the third strobe next to the second strobe detects the change point zeroed.

Still more, the adjustment means 56 changes the delay times of the variable delay circuit 46 to be adjusted in ascending or descending order for example to set the delay time of the variable delay circuit 46 to be adjusted based on the encode data corresponding to the respective delay times. In another mode, the adjustment means 56 may be arranged so as to change the delay time of the variable delay circuit 46 to be adjusted based on a dichotomizing search for example to detect the optimum delay time.

Intervals of the respective strobes in the multi-strobe may be set accurately to desirable intervals by carrying out the setting of the delay time described above on all the variable delay circuits 46 sequentially from the first stage. The test apparatus 100 also adjusts the delay time of the variable delay circuit 46 by using an output signal transmitting route including the delay elements 42 and the comparators 44 used in testing the electronic device 200. Therefore, it is possible to reduce an effect of timing error of the output signal and the multi-strobe which takes place due to the characteristics of the output signal transmitting route in testing the electronic device 200. For instance, the effect caused by response characteristics of the comparator 44 may be reduced.

Figures 8A, 8B:
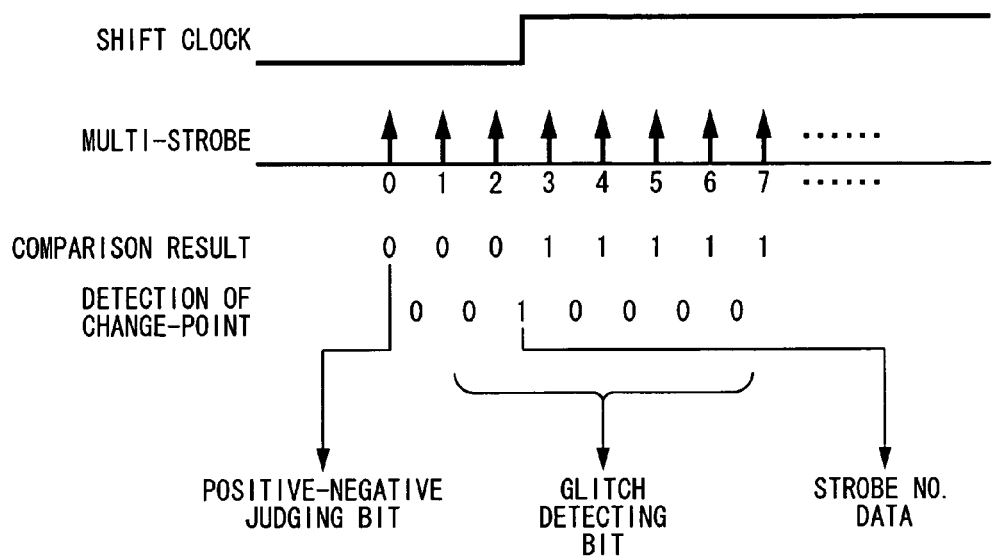

FIGS. 8A and 8B show one example of data structure of encode data. As shown in FIG. 8A, the change-point detector 60 generates the encode data based on the comparison result of the comparator 44. As explained before with reference to FIG. 4, the plurality of exclusive OR circuits 62 generates detected change-point data indicating the position of the strobe by which the change point has been detected based on the comparison result of the comparator 44 and the encoder 64 encodes the detected change-point data and generates Strobe No. data indicating No. of the strobe by which the change point has been detected in the multi-strobe. In the present embodiment, the change-point detector 60 generates encode data showing Strobe No. by a plurality of bits as shown in encode data in FIG. 8B.

When there is no strobe by which the change point is detected in the multi-strobe, the encoder 64 generates encode data wherein Strobe No. is zero as encode data of that multi-strobe. Thereby, the adjustment means 56 can readily judge whether or not the multi-strobe corresponding to the encode data has detected a change point and the strobe by which the change point has been detected.

The change-point detector 60 also generates encode data indicating whether or not the corresponding multi-strobe has detected a glitch of the shift clock per every multi-strobe. In the present embodiment, the change-point detector 60 generates the encode data further including glitch detection bits indicating whether or not any glitch exists.

The change-point detector 60 also generates encode data further including positive-negative judging bits indicating whether the detected change point of the value of the shift clock has changed from L level to H level or from H level to L level. In the present embodiment, the change-point detector 60 generates the encode data in which the comparison result of the first-stage comparator 44-1 is set as the positive-negative judging bit.

The multi-strobe generation apparatus 30 described above is capable of controlling the timing of each strobe accurately. Still more, it is capable of controlling the timing of each strobe simply because it requires no circuit for synchronizing the shift clock with the strobe signal.

Figure 9:
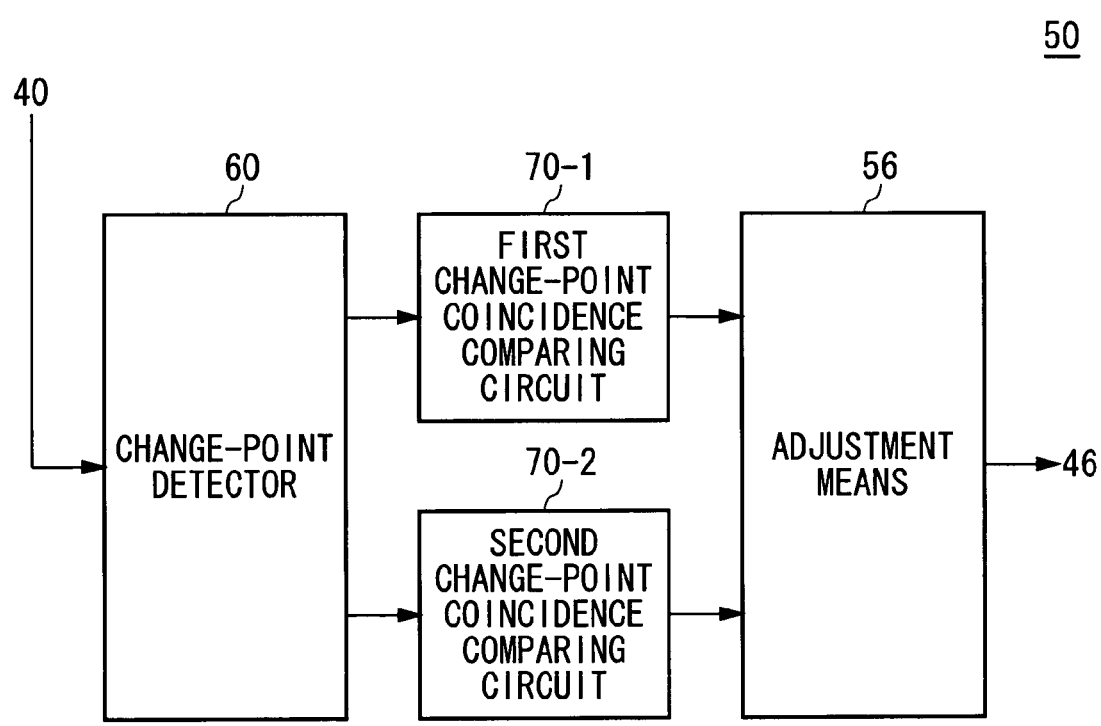
FIG. 9 shows another exemplary configuration of an adjustment section.

FIG. 9 is a diagram showing another exemplary configuration of the adjustment section 50. The adjustment section 50 has the change-point detector 60, a first change-point coincidence comparing circuit 70-1, a second change-point coincidence comparing circuit 70-2 and the adjustment means 56. The components in FIG. 9 having the same reference numerals with those in FIG. 3 have the same or similar function and structure with the components explained with reference to FIG. 3.

The first change-point coincidence comparing circuit 70-1 judges whether or not each encode data indicates that a change point has been detected by the predetermined strobe. The second change-point coincidence comparing circuit 70-2 judges whether or not each encode data indicates that a change point has been detected by the strobe next to the predetermined strobe. The adjustment means 56 sets the delay time of the variable delay circuit 46 outputting the predetermined strobe so that a number of times when the first change-point coincidence comparing circuit 70-1 judges that the change point has been detected by the predetermined strobe is almost equal to a number of times when the second change-point coincidence comparing circuit 70-2 judges that the change point has been detected by the strobe next to the predetermined strobe.

Still more, in setting the delay time of the variable delay circuit 46-1, the first change-point coincidence comparing circuit 70-1 judges whether or not the second strobe has detected the change point and the second change-point coincidence comparing circuit 70-2 judges whether or not the third strobe has detected the change point also in this example. The adjustment means 56 sets the delay time of the variable delay circuit 46-1 so that a number of times when the first change-point coincidence comparing circuit 70-1 judges that the change point has been detected by the second strobe is almost a half of number of times when the shift clock is generated and so that a number of times when the second change-point coincidence comparing circuit 70-2 judges that the change point has been detected by the third strobe is zeroed.

Figure 10:
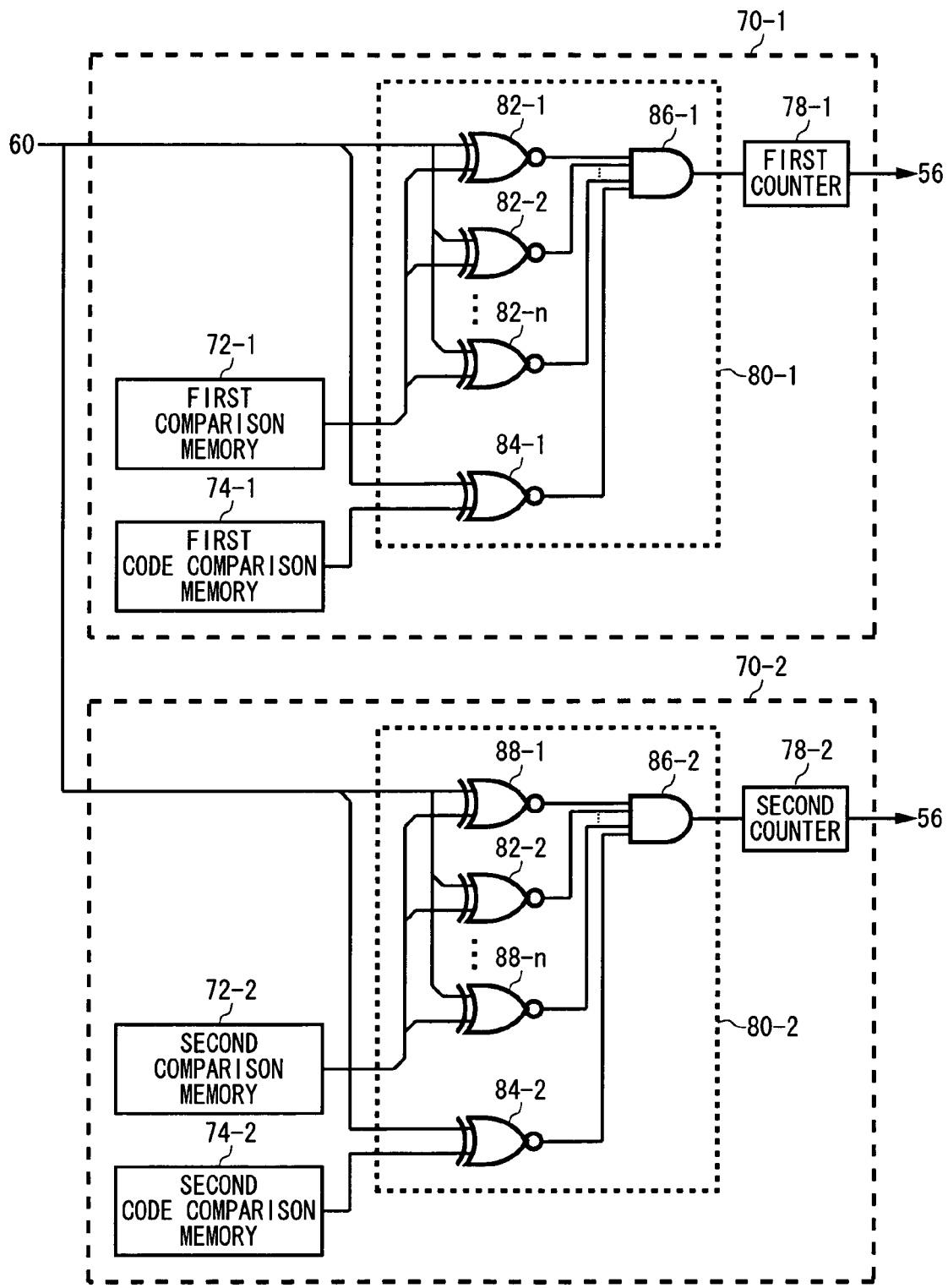
FIG. 10 is a diagram showing one exemplary configuration of a first change-point coincidence comparing circuit and a second change-point coincidence comparing circuit.

FIG. 10 is a diagram showing one exemplary configuration of the first change-point coincidence comparing circuit 70-1 and the second change-point coincidence comparing circuit 70-2. The first change-point coincidence comparing circuit 70-1 has a first comparison memory 72-1 for storing first comparison data indicating No. of a predetermined strobe whose timing is to be adjusted in a multi-strobe, a first detected-position comparator 80-1 for judging whether or not the Strobe No. data in the encode data indicating No. of a strobe by which a change point is detected coincides with the first comparison data, a code comparing memory 74-1 for storing an expected value of the positive-negative judging bit of a change point to be detected and a first counter 78-1 for counting a number of times when the Strobe No. data coincides with the comparison data in the first detected-position comparator 80-1.

The second change-point coincidence comparing circuit 70-2 has a second comparison memory 72-2 for storing second comparison data indicating No. of a strobe next to the strobe whose timing is to be adjusted in a multi-strobe, a second detected-position comparator 80-2 for judging whether or not the strobe No. data in the encode data indicating No. of a strobe by which the change point is detected coincides with the second comparison data, a code comparing memory 74-2 for storing an expected value of the positive-negative judging bit of a change point to be detected and a second counter 78-2 for counting a number of times when the Strobe No. data coincides with the comparison data in the second detected-position comparator 80-2.

The first detected-position comparator 80-1 has a plurality of first exclusive OR circuits 82 outputting logic H when the respective bits composing the first comparison data coincide with the bits of the corresponding Strobe No. and a first AND circuit 86-1 outputting a conjunction of outputs of each exclusive OR circuits 82 and the second detected-position comparator 80-2 has a plurality of second exclusive OR circuits 88 outputting logic H when the respective bits of the second comparison data coincide with the bits of the corresponding Strobe No. and a second AND circuit 86-2 outputting a conjunction of outputs of each exclusive OR circuit 88. The first and second counters 78-1 and 78-2 count a number of times when the corresponding AND circuit 86 outputs logic H as a number of times when change points are detected. Here, the exclusive OR circuit includes a circuit that outputs a negation of exclusive OR as shown in FIG. 10.

In the present embodiment, the first detected-position comparator 80-1 and the second detected-position comparator 80-2 have an exclusive OR circuit 84, respectively, for comparing the positive-negative judging bit of the encode data with the expected value stored in the respective code comparing memories 74. The respective AND circuits 86 also receive outputs of the exclusive OR circuits 84 and output AND. It enables the delay time of the variable delay circuit 46 to be set accurately because it enables either number of times when the leading edge or the trailing edge is detected to be selected among change points of the value of the shift clock.

The adjustment means 56 sets the delay time of the variable delay circuit 46 to be adjusted so that the number of times counted by the first counter 78-1 is almost equalized with the number of times counted by the second counter 78-2. The adjustment section 50 of the present embodiment allows a memory capacity to be remarkably reduced because it does not require to store all encode data in the memory.

Figure 11:
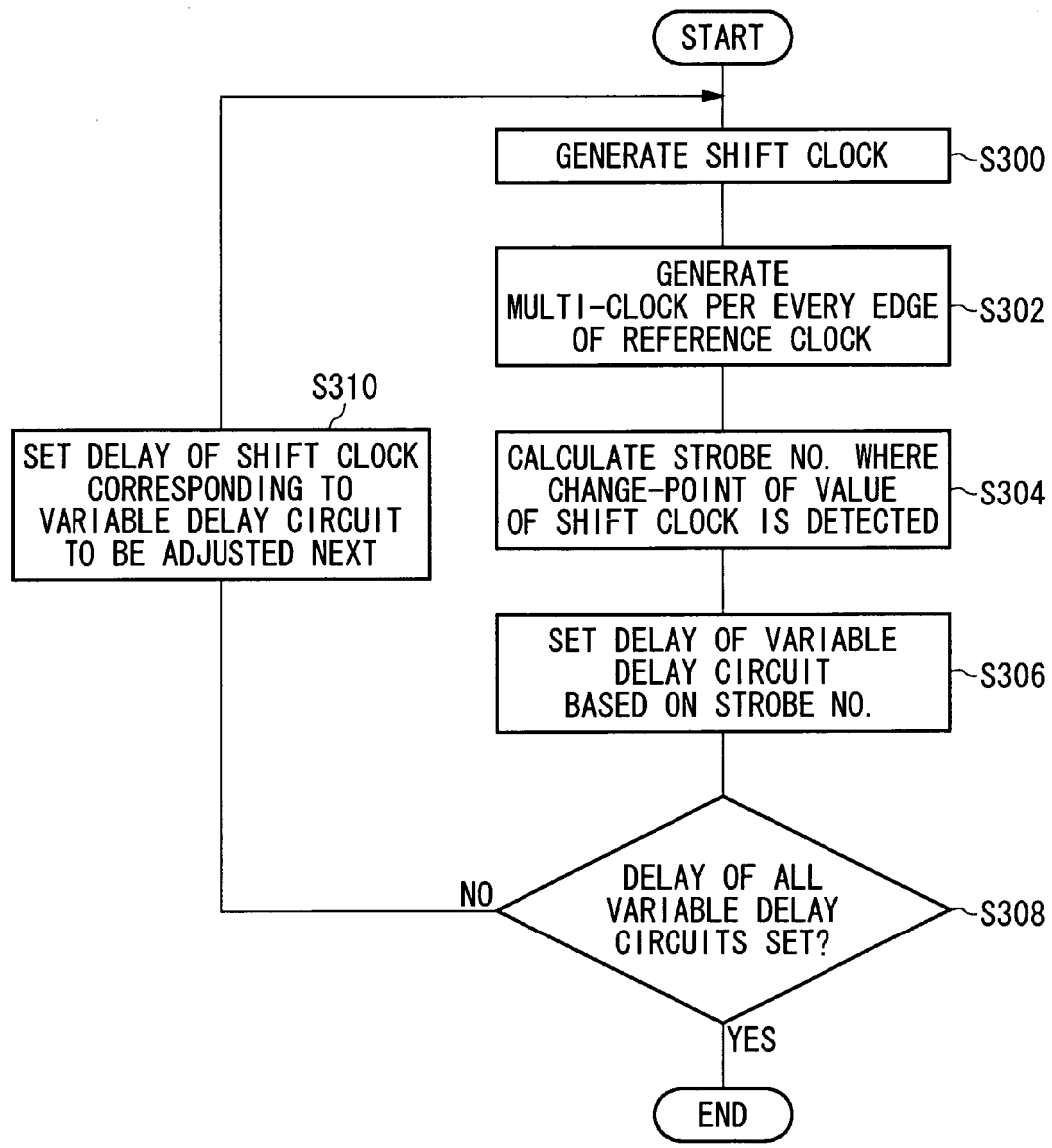
FIG. 11 is a flowchart showing one example of the method for adjusting the strobe generating timing of each multi-strobe of the invention.

FIG. 11 is a flowchart showing one example of a method for adjusting generation timing of each strobe in a multi-strobe. At first, a shift clock generated by dividing the reference clock is output at a timing at which a strobe whose timing is to be adjusted is generated in a shift clock generating step S300. Step S300 may be carried out by using the shift clock generating section 20 explained with reference to FIG. 3.

Next, a multi-strobe is generated corresponding to each leading or trailing edge of the reference clock in a strobe generating step S302. Step S302 may be carried out by using the strobe generating section 40 explained with reference to FIG. 3.

Next, the timing for generating each strobe in the strobe generating step S302 is adjusted based on the shift clock in adjustment stages of Steps S304 through S310. At first, Strobe No. by which the change point of the value of the shift clock has been detected is calculated in Step S304. Step S304 may be carried out by using the change-point detector 60 explained with reference to FIG. 3. Next, a delay of the variable delay circuit for generating the strobe is set based on the calculated strobe No. in Step S306. Step S306 may be carried out by using the adjustment means 56 explained with reference to FIG. 3.

Then, it is judged whether or not the delay of all the variable delay circuits have been set in Step S308. The process ends when the delay of all the variable delay circuits have been set. When the delay of all the variable delay circuits have not been set, the delay of the shift clock is set corresponding to the delay of the variable delay circuit to be adjusted next and the processes of Steps S300 through S310 are repeated until when the delay is set for all the variable delay circuits.

As it is apparent from the above description, the adjustment method of the present embodiment allows the timing for generating each strobe of the multi-strobe to be adjusted accurately.

Still more, the invention allows the multi-strobe wherein the timing for generating each strobe is accurately controlled to be generated. Thereby, the invention allows electronic devices to be accurately tested.

Although the invention has been described by way of an exemplary embodiments, it should be understood that those skilled in the art might make many changes and substitutions without departing from the spirit and the scope of the invention. It is obvious from the definition of the appended claims that the embodiments with such modifications also belong to the scope of the invention.

What is claimed is:

1. A multi-strobe generation apparatus for generating a multi-strobe having a plurality of strobes, comprising:
    a shift clock generating section which outputs a shift clock generated by dividing a reference clock at a timing at which each strobe is generated;
    a strobe generating section for generating said multi-strobe corresponding to each leading or trailing edge of said reference clock; and
    an adjustment section for adjusting timing at which said strobe generating section generates said each strobe based on said shift clock.

2. The multi-strobe generation apparatus as claimed in claim 1, wherein said adjustment section adjusts the timing of said each strobe based on a value of said shift clock in said each strobe in said multi-strobe by which a change point of the value of said shift clock is detected among said multi-strobes generated by said strobe generating section.

3. The multi-strobe generation apparatus as claimed in claim 2, wherein said shift clock generating section generates said shift clocks sequentially in correspondence to a plurality of timings at which said plurality of strobes is to be generated; and
    said adjustment section adjusts the timing at which said strobe generating section generates said corresponding strobes based on the respective shift clocks generated in correspondence to said plurality of timings.

4. The multi-strobe generation apparatus as claimed in claim 3, wherein said strobe generating section has a plurality of cascade-connected variable delay circuits that receives strobe signals, delays the received strobe signals by a predetermined time and outputs them sequentially as said strobes; and
    said adjustment section adjusts the delay time of said corresponding variable delay circuit sequentially based on said each shift clock.

5. The multi-strobe generation apparatus as claimed in claim 4, further comprising a plurality of comparators, provided respectively in correspondence to any one of said variable delay circuits, for comparing the timing of said strobes output by said corresponding variable delay circuit with the timing of said shift clock; and wherein
    said adjustment section adjusts the delay time of said each variable delay circuit based on the comparison result of said corresponding comparator.

6. The multi-strobe generation apparatus as claimed in claim 5, wherein said adjustment section changes delay time of said variable delay circuit that is to adjust the delay time and sets the delay time of said variable delay circuit to be adjusted at delay time when said comparator judges that the timing of said strobe output by said variable delay circuit to be adjusted almost coincides with the timing of said shift clock.

7. The multi-strobe generation apparatus as claimed in claim 6, wherein said variable delay circuit outputs said strobe by plural times per each delay time changed by said adjustment section;
    said shift clock generating section generates said shift clock whose value changes by plural times at the timing when said variable delay circuit to be adjusted is to output said strobe;
    said comparator detects the value of said shift clock by using said strobe output by the plural times; and
    said adjustment section has a change-point detector for judging said strobe by which the change point of the value of said shift clock generated by the plural times is detected based on the comparison result of said comparator and sets the delay time of said each variable delay circuit based on the judgment result of said change-point detector.

8. The multi-strobe generation apparatus as claimed in claim 7, wherein said adjustment section sets the delay time of said variable delay circuit outputting a first strobe so that a number of times when a second strobe next to said first strobe detects said change point is almost a half of a number of times when said shift clock is generated and so that a number of times when a third strobe next to said second strobe detects said change point is zeroed in setting the timing of said first strobe indicating the initial strobe in said multi-strobe by which said change point is detected.

9. The multi-strobe generation apparatus as claimed in claim 8, wherein said adjustment section sets the delay time of said variable delay circuit outputting said second strobe so that a number of times when said second strobe detects said change point is almost equal to a number of times when said third strobe detects said change point in setting the timing of said second strobe in said multi-strobe by which said change point is detected.

10. The multi-strobe generation apparatus as claimed in claim 9, wherein said change-point detector encodes the comparison result of said comparator and generates encode data indicating a number of said strobe by which said change point is detected in said multi-strobe per said multi-strobe.

11. The multi-strobe generation apparatus as claimed in claim 10, wherein said change-point detector generates said encode data indicating whether or not said corresponding multi-strobe has detected said change point per multi-strobe.

12. The multi-strobe generation apparatus as claimed in claim 11, wherein said adjustment section has also an encode memory for storing said encode data generated by said change-point detector.

13. The multi-strobe generation apparatus as claimed in claim 11, wherein said change-point detector generates said encode data further indicating whether or not said corresponding multi-strobe has detected glitch in said shift clock per every multi-strobe.

14. The multi-strobe generation apparatus as claimed in claim 10, wherein said adjustment section has also an encode memory for storing said encode data generated by said change-point detector.

15. The multi-strobe generation apparatus as claimed in claim 13, wherein said adjustment section has also an encode memory for storing said encode data generated by said change-point detector.

16. The multi-strobe generation apparatus as claimed in claim 10, wherein said adjustment section has also a first change-point coincidence comparing circuit for judging whether or not said each encode data indicates that said change point has been detected by one said strobe; and
a second change-point coincidence comparing circuit for judging whether or not said each encode data indicates that said change point has been detected by the strobe next to said one strobe; wherein
the delay time of said variable delay circuit outputting said one strobe is set so that a number of times when said first change-point coincidence comparing circuit judges that said change point has been detected by said one strobe is almost equalized with a number of times when said second change-point coincidence comparing circuit judges that said change point has been detected in said next strobe.

17. The multi-strobe generation apparatus as claimed in claim 16, wherein said first change-point coincidence circuit comprises:
a first comparison memory for storing first comparison data indicating a number of said one strobe in said multi-strobe; and
a first detected-position comparator for judging whether or not a Strobe number data indicating a number of said strobe by which said change point has been detected coincides with said first comparison data, and
said second change-point coincidence circuit has a second comparison memory for storing second comparison data indicating a number of said next strobe in said multi-strobe; and
a second detected-position comparator for judging whether or not Strobe number data indicating a number of said strobe by which said change point has been detected coincides with said second comparison data.

18. The multi-strobe generation apparatus as claimed in claim 17, wherein said first detected-position comparator comprises:
a plurality of first exclusive OR circuits outputting logic H when the respective bits composing said first comparison data coincides with the bits of said corresponding Strobe number data;
a first AND circuit for outputting AND of the output of said each exclusive OR circuit; and
a first counter outputting a number of times when said AND circuit outputs logic H as a number of times when said change point has been detected by said one strobe, and
said second detected-position comparator comprises:
a second exclusive OR circuit outputting logic H when the respective bits composing said second comparison data coincides with the bits of said corresponding Strobe number data;
a second AND circuit for outputting AND of the output of said each exclusive OR circuit; and
a second counter outputting a number of times when said AND circuit outputs logic H as a number of times when said change point has been detected by said next strobe.

19. A test apparatus for testing electronic devices, comprising:
a pattern generator for generating a test pattern for testing said electronic device;
a pattern formatter for formatting said test pattern to supply to said electronic device; and
a judging device for judging pass/fail of said electronic device based on an output signal output by said electronic device corresponding to said test pattern,
wherein said judging device comprises a multi-strobe generation apparatus for generating a multi-strobe having a plurality of strobes for detecting a value of said output signal, and said multi-strobe generation apparatus comprises:
a shift clock generating section which outputs a shift clock generated by dividing a reference clock at a timing at which each strobe is generated;
a strobe generating section for generating said multi-strobe corresponding to each leading or trailing edge of said reference clock; and
an adjustment section for adjusting timing at which said strobe generating section generates each strobe based on said shift clock.

20. An adjustment method for adjusting timing for generating each strobe of a multi-strobe having the plurality of strobes, comprising:
a shift clock generating step for generating a shift clock generated by dividing a reference clock at a timing at which each strobe is generated;
a strobe generating step for generating said multi-strobe corresponding to each leading or trailing edge of said reference clock; and
an adjustment step for adjusting timing at which said strobe generating section generates each strobe based on said shift clock.

* * * * *